United States Patent
Ando et al.

(10) Patent No.: US 6,550,037 B2
(45) Date of Patent: Apr. 15, 2003

(54) METHOD FOR DESIGNING A DECOUPLING CIRCUIT

(75) Inventors: Noriaki Ando, Tokyo (JP); Hitoshi Irino, Tokyo (JP); Hiroshi Wabuka, Tokyo (JP); Hirokazu Tohya, Tokyo (JP)

(73) Assignee: NEC Corporation, Tokyo (JP)

( * ) Notice: Subject to any disclaimer, the term of this patent is extended or adjusted under 35 U.S.C. 154(b) by 161 days.

(21) Appl. No.: 09/729,852

(22) Filed: Dec. 6, 2000

(65) Prior Publication Data

US 2001/0014963 A1 Aug. 16, 2001

(30) Foreign Application Priority Data

Dec. 6, 1999 (JP) .......................... 11-346680

(51) Int. Cl.[7] ............................................. G06F 17/50
(52) U.S. Cl. ..................... 716/1; 174/35 R; 174/261
(58) Field of Search .......................... 716/1–21; 703/2, 703/18; 702/65; 361/780, 763, 762, 117; 324/750; 257/724, 691; 174/35 R, 261

(56) References Cited

U.S. PATENT DOCUMENTS 6,359,237 B1 * 3/2002 Tohya et al. ............. 174/261
6,365,828 B1 * 4/2002 Kinoshia et al. ......... 174/35 R

FOREIGN PATENT DOCUMENTS

| JP | 09-139573 | 5/1997 |
| JP | 10-97560 | 4/1998 |
| JP | 11-15870 | 1/1999 |

\* cited by examiner

*Primary Examiner*—Matthew Smith
*Assistant Examiner*—H Rossoshek
(74) *Attorney, Agent, or Firm*—Sughrue Mion, PLLC

(57) ABSTRACT

A method for designing a decoupling circuit for a source line of a LSI includes the steps of determining the capacitance of the decoupling capacitor based on the electric charge necessary for one cycle operation of the LSI and the allowable fluctuation of the source voltage, and determining the inductance of the source line based on the impedance of the decoupling capacitor and the allowable minimum multiplexing ratio of the source current by the decoupling capacitor.

9 Claims, 10 Drawing Sheets

METHOD FOR DESIGNING A DECOUPLING CIRCUIT

BACKGROUND OF THE INVENTION (a) Field of the Invention

The present invention relates to a method for designing a decoupling circuit and, more particularly, to a method suitable for designing a decoupling circuit for each of power source lines (power supply lines) of a plurality of semiconductor integrated circuits (LSIs) mounted on a common multilayer printed circuit board.

(b) Description of the Related Art

Digital circuits generally generate unwanted electromagnetic field emissions (EMIs) from multilayer printed circuit boards. Most of the EMIs are generated from the signal transmission lines as well as from the power source lines constituting resonators together with the ground layer of the PCB. This fact necessitates employment of a counter measure for the EMIs in the power source line. It is generally effective to use a decoupling circuit for suppressing the EMIs.

For instance, in Patent Publications JP-A-10-97560 and JP-A-11-15870, effective areas for disposing capacitors therein for suppressing the EMIs are depicted on a drawing for the layout of the printed circuit board. The methods described therein, however, have a disadvantage in that the design for selecting the capacitance of the capacitors cannot be specifically determined. In particular, in a design for designing a power source system including a main source line and a plurality of branch source lines each disposed for a corresponding LSI, most part of the higher-frequency current components in the operational current for driving the LSI is supplied from the decoupling capacitors, and the electric charge supplied therefrom differs depending on the circuit configurations and the operations of the internals of the LSIs. This means that selection of the decoupling capacitor for each LSI is preferably conducted for each of the LSIs while considering the characteristics of the each of the LSIs.

However, even if the circuit configuration of the LSI is known, the technique for determining the decoupling capacitor from the circuit configurations is vet to be determined. In short, there is no known design theory by which the circuit designers or users specifically determine the decoupling capacitor. In addition, for a larger number of LSIs disposed on a printed circuit board, it costs a larger amount of time to determine the decoupling capacitors for the respective LSIs.

In a technique such as described in JP-A-9-139573, a planar power source layer conventionally used for the printed circuit board is configured as respective source lines each having a specific width to thereby increase the impedance of the source line for supplying electric power to a corresponding LSI in a higher frequency range. This impedes to some extent higher-frequency current components from transferring through the source lines on the printed circuit board, whereby the electromagnetic field emission from the power source line is suppressed.

In the described technique, it is necessary to determine the length of the power source line, differently from the case of the planar source layer, because the power source line on the printed circuit board should have as small a length as possible in view of the restriction from the practical size etc. of the printed circuit board. However, the technique for determining the length of the source line is yet to be established. In view of the EMI reduction, a larger capacitance of the decoupling capacitor and a larger impedance of the source line on the printed circuit board are preferable due to a higher efficiency of decoupling.

For suppressing the higher-frequency current components flowing through the source line on the printed circuit board, it is also effective to determine the inductance of the source line on the printed circuit board for the object LSI based on the characteristics of the object LSI as well as determining the decoupling capacitor as described above. This is because the higher-frequency current components flowing through the source line depend on the configuration and the circuit scale of the LSI. The design for layout of the source lines requires a large amount of design work in view of the large number of LSIs mounted on the printed circuit board

SUMMARY OF THE INVENTION

In view of the above problems in the conventional technique, it is an object of the present invention to provide a method for power source decoupling in a printed circuit board mounting thereon a plurality of LSIs, which is capable of allowing reduction of unwanted electromagnetic field emission from the source lines while reducing the amount of design work for the decoupling circuit.

The present invention provides a method for designing a decoupling circuit for a source line of a LSI to be disposed on a printed circuit board. The method comprises the steps of determining a capacitance of a decoupling capacitor based on electric charge necessary for driving the LSI in a specified period and an allowable voltage fluctuation of a source voltage at a source terminal of the LSI, and determining an inductance of the source line based on an impedance of the decoupling capacitor and a multiplexing ratio of the source current of the LSI by the decoupling capacitor.

In accordance with the method of the present invention, a decoupling circuit can be designed for the source line of the LSI with a reduced design work. The resultant decoupling circuit has a decoupling circuit which allows the source line and the decoupling capacitor to supply the electric charge necessary for driving the LSI and an inductance of the source line which allows an effective source decoupling for the LSI.

The above and other objects, features and advantages of the present invention will be more apparent from the following description, referring to the accompanying drawings.

PREFERRED EMBODIMENTS OF THE INVENTION

Figure 1:
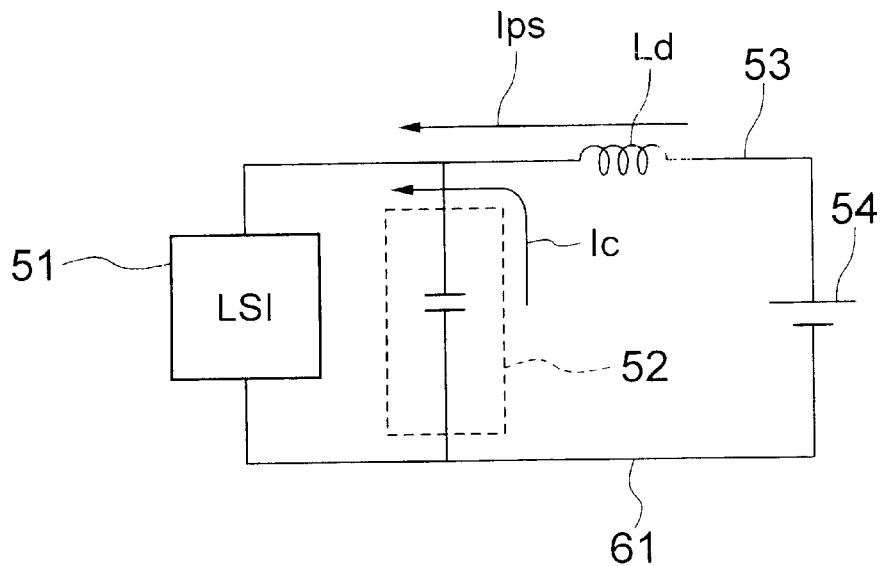
FIG. 1 is a circuit diagram of a general power source decoupling circuit to be designed for a source line of a LSI by the method of the present invention.

Now, the present invention is more specifically described with reference to accompanying drawings, wherein similar constituent elements are designated by similar or related reference numerals.

Referring to FIG. 1, a decoupling circuit for a source line to be designed by the method of the present invention includes a decoupling capacitor 52 connected in parallel with an object LSI 51 between a source line 53 and a ground line 61, and a decoupling inductor (Ld) connected in series with the LSI 51 and formed by the structure of the source line 53. The source lines 53 carries current Ips supplied from a power source 54, whereas the decoupling capacitor 52 supplies a current Ic to the LSI during a short interval of the operation thereof. The method of the present invention determines the electric parameters of the decoupling capacitor 52 and the inductor 53.

Figure 2:
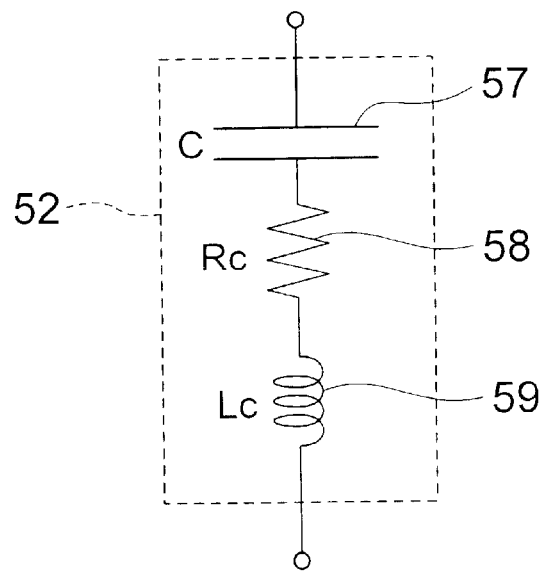
FIG. 2 is an equivalent circuit diagram of the decoupling capacitor shown in FIG. 1.

Referring to FIG. 2, the decoupling capacitor 52 shown in FIG. 1 in fact has a serial electric elements including a capacitance 57, an equivalent serial resistance 58 and an equivalent serial inductance 59, the values of which are determined by the method of the present invention.

Figure 3:
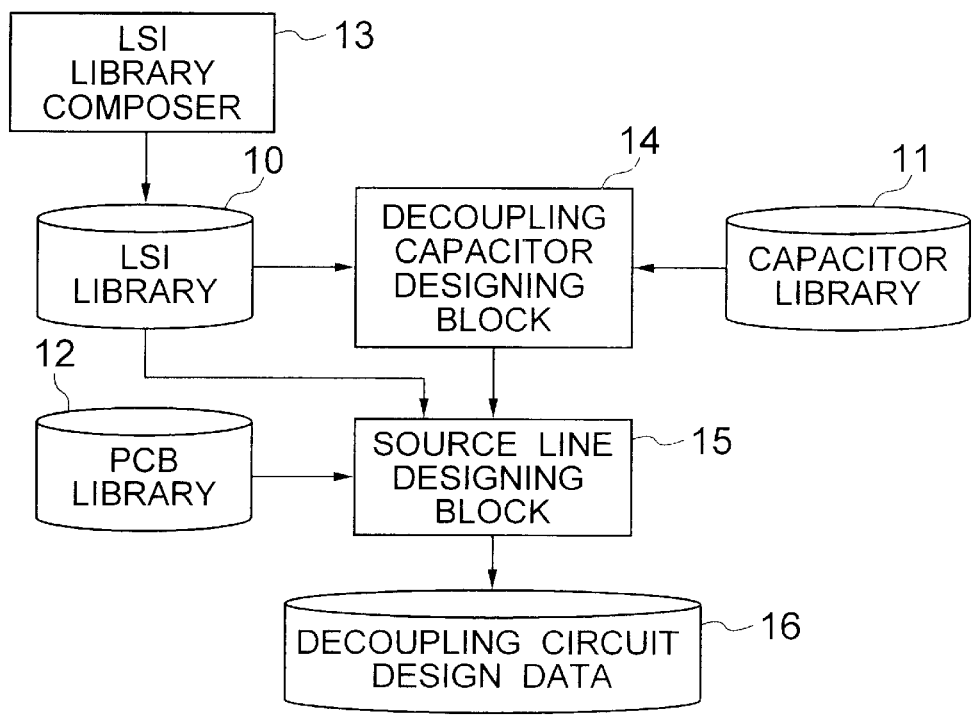
FIG. 3 is a block diagram of a design system for designing the decoupling circuit of FIG. 1 according to an embodiment of the present invention.

Referring to FIG. 3, a decoupling circuit design system for designing the decoupling circuit of FIG. 1 according to an embodiment of the present invention includes a LSI library 10, a capacitor library 11, a printed circuit board (PCB) library 12, a LSI library composer 13, a decoupling capacitor designing block 14, and a source line designing block 15, and generates the design results of a decoupling circuit such as shown in FIG. 1. Information stored in each of the libraries 10, 11 and 12 can be updated to and/or added with new information.

The LSI library 10 stores therein information for a variety of object LSIs to be mounted on the PCB, the information including part number (LSI code), source terminal, source voltage VDD, minimum frequency fmin and maximum frequency fmax of the design frequency, electric charge "Q" supplied to the object LSI in one operational cycle, average current Iave etc. of each of the object LSIs. If the object LSI includes a plurality of source terminals, these data are stored for each of the source terminals.

The capacitor library 11 stores therein information for a variety of existing types of capacitors, the information including part name, capacitance "C", equivalent serial resistance $R_C$, equivalent serial inductance $L_C$ for each of the existing capacitors.

The PCB library 12 stores therein information for a variety of PCBs, including layered structures thereof, the thicknesses of the conductor layers, thickness, dielectric constant and relative permeability of each of insulator layers, minimum width of the source line for a unit current in the PCB etc. The layered structure of the LSI determines the decoupling inductance per unit length of the source line 53.

The LSI library composer 13 calculates parameters such as minimum frequency "fmin" and maximum frequency "fmax" of the source current, electric charge "Q" used in one cycle operation, average current "Iave" etc. of a LSI to be mounted on the PCB. The LSI library composer 13 stores in the LSI library 10 these parameters of the LSI in connection with the respective source voltages VDD, part names and source terminals thereof.

Figure 4:
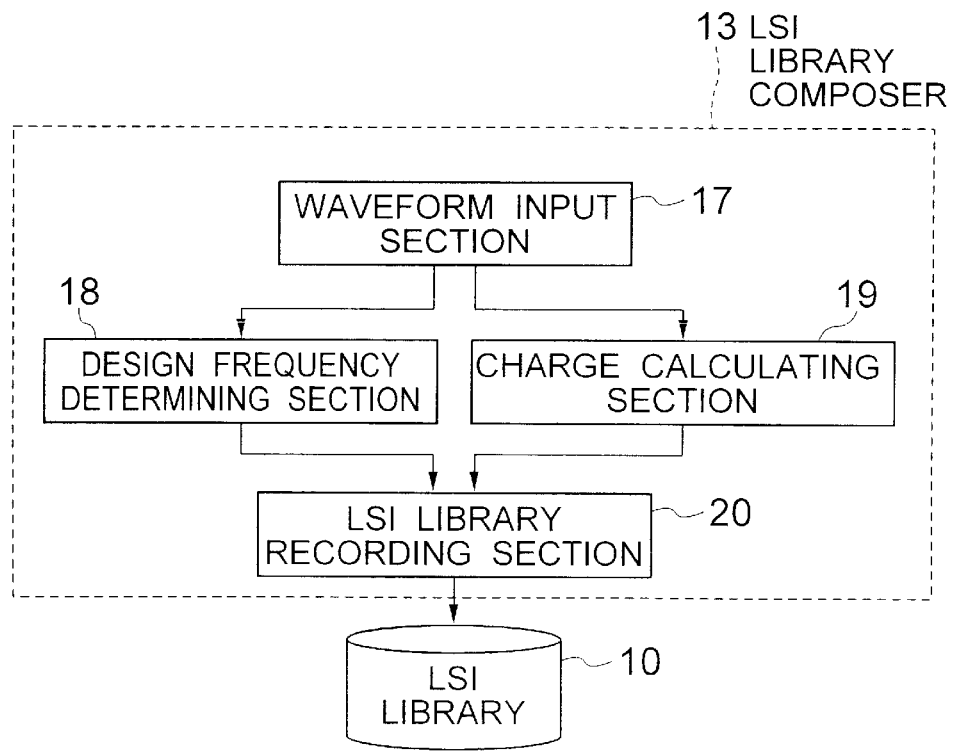
FIG. 4 is a block diagram of the LSI library composer 13 shown in FIG. 3.

Referring to FIG. 4, the LSI library composer 13 includes a waveform input section 17, design frequency determining section 18, charge calculating section 19, a LSI library recording section 20, and delivers its outputs to the LSI library 10 for storage.

Figure 5:
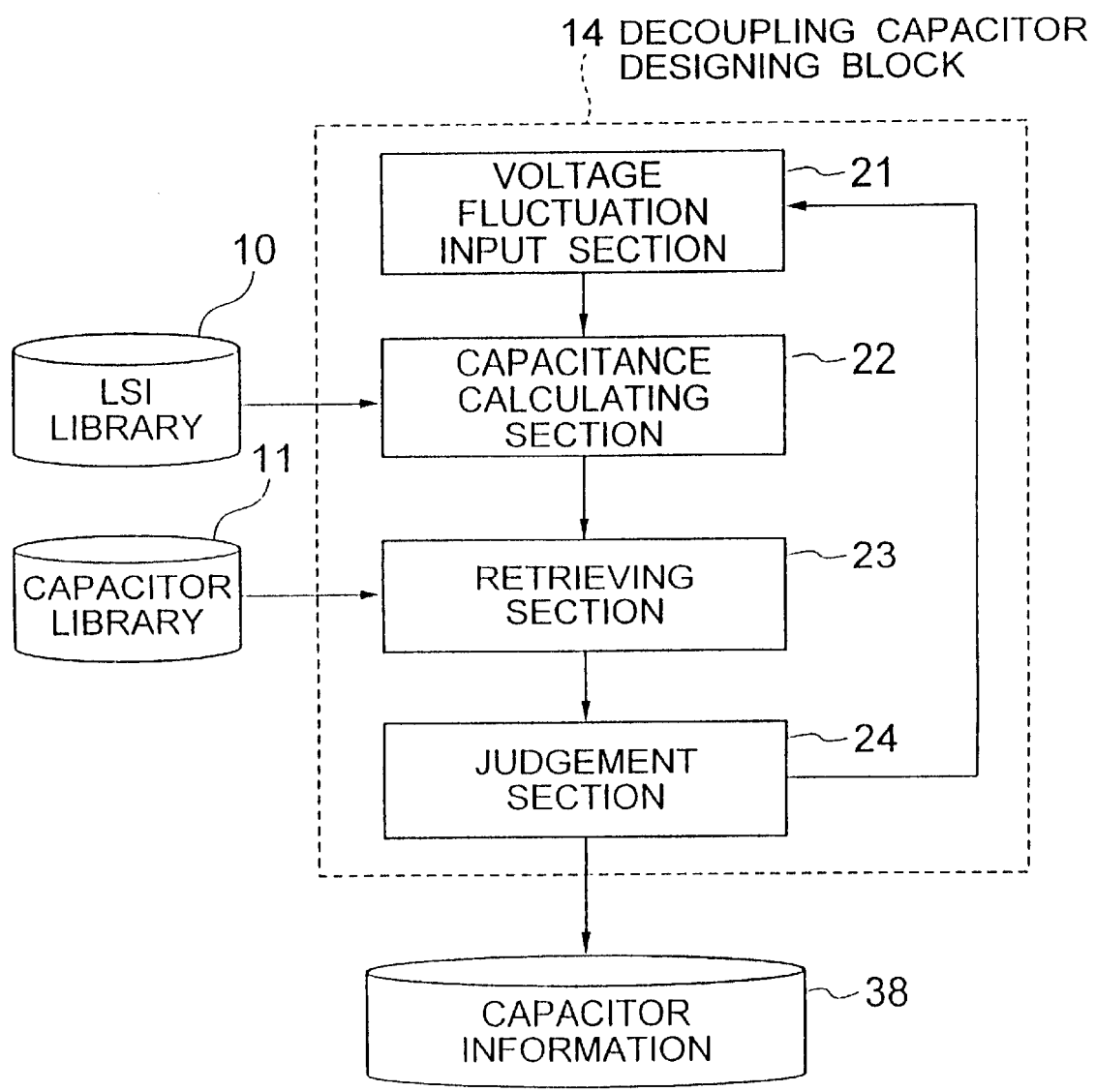
FIG. 5 is a block diagram of the decoupling capacitor designing block 14 shown in FIG. 3.

The decoupling capacitor designing block 14 determines the capacitance of the decoupling capacitor based on the electric charge Q and an allowable fluctuation (or voltage drop) ΔV of the source voltage. Referring to FIG. 5, the decoupling capacitor designing block 14 includes a voltage fluctuation input section 21, a capacitance calculating section 22, a retrieving section 23 and a judgement section 24, and delivers its outputs as capacitor information 38.

The source line designing block 15 determines the length and width of the source line for an object LSI in the PCB based on the impedance characteristics of the decoupling capacitor 52 prepared by the decoupling capacitor designing section 14 and an allowable multiplexing ratio of the decoupling capacitor 52. The term "multiplexing ratio" as used herein means the ratio of the current Ic supplied from the decoupling capacitor to the current Ips supplied through the source line during a short interval.

Figure 6:
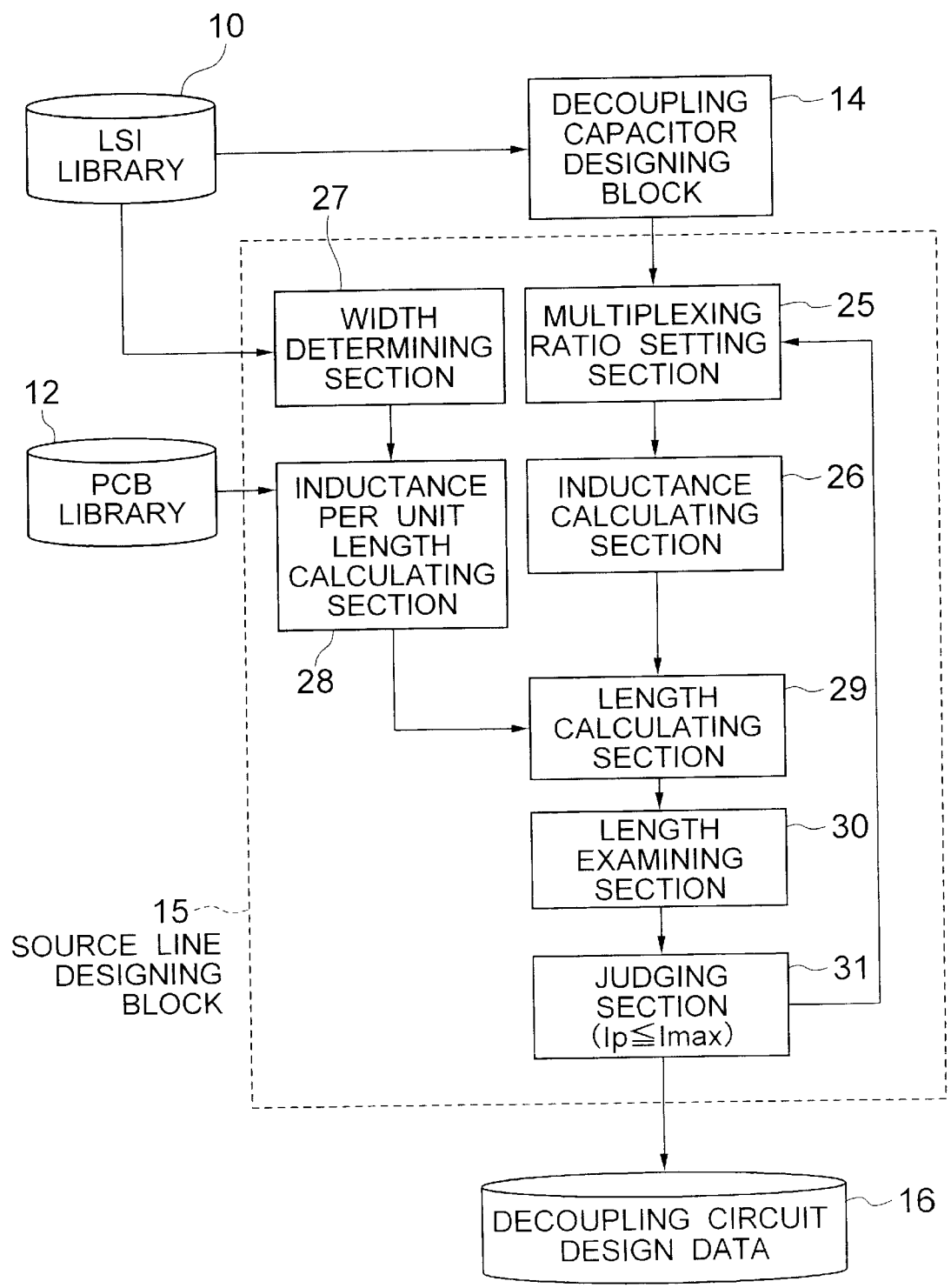
FIG. 6 is a block diagram of the source line designing block 15 shown in FIG. 3.

Referring to FIG. 6, the source line designing block 15 includes a multiplexing ratio setting section 25, an inductance calculating section 26, width determining section 27, an inductance per unit length calculating section 28, a length calculating section 29, a length examining section 30 and a judgement section 31, and delivers the decoupling circuit design data 16.

In FIG. 4, the waveform input section 17 inputs the waveform of the source current for the object LSI in one operational cycle thereof based on the results of simulations or experiments. The design frequency determining section 18 determines the minimum frequency fmin and the maximum frequency fmax of the design frequency of the object LSI. The design minimum and maximum frequencies are determined either by the frequency band (between 30 MHz and 1 GHz) of the regulated EMI (electromagnetic interference) itself or by the regulated frequency band in consideration of the operational frequency f0 of the object LSI. More specifically, if the operational frequency f0 is equal to or above the standard frequency (30 MHz), the operational frequency f0 is used as the minimum frequency fmin and the maximum frequency fmax is set at 1 GHz. On the other hand, if the operational frequency f0 is lower than the standard frequency 30 MHz, the standard frequency is used as the minimum frequency and the maximum frequency is set at 1 GHz. This is because it is not necessary to consider the frequency range that is above or below the regulated frequency band, and because most part of the spectrum of the electromagnetic field emission measured as the EMI appears at frequencies which are integral multiples of the operational frequency f0 and thus the EMI below the operational frequency can be neglected.

The charge calculating section 19 calculates electric charge "Q" necessary for one cycle operation of the LSI based on the waveform of the source current for a single clock cycle input by the waveform input section 17. The calculated electric charge "Q" is the total electric charge of the LSI injected through the source terminal to the LSI. The LSI library recording section 20 registers the parameters including the minimum frequency fmin, the maximum frequency fmax, the electric charge "Q" necessary for one cycle operation and the source voltage VDD of a new object LSI in the LSI library 10 when the new LSI is to be registered. These parameters are registered in connection with the part number and the source terminal of the LSI.

The decoupling capacitor designing block 14 determines the capacitance of the decoupling capacitor based on the electric charge "Q" and the allowable voltage fluctuation $\Delta V$ of the source voltage.

In the above operation of the decoupling capacitor designing block 14, the voltage fluctuation input section 21 first inputs the allowable fluctuation $\Delta V$. The decoupling capacitor 52 to be used herein must have a sufficient capacitance necessary for supplying the total electric charge which is sufficient to drive the LSI.

The capacitance calculating section 22 calculates the minimum capacitance of the decoupling capacitor based on the ratio of the electric charge "Q" to the allowable fluctuation $\Delta V$.

The retrieving section 23 retrieves from the capacitor library 11 a capacitor having the minimum capacitance among the capacitors each having a capacitance above the ratio Q/$\Delta V$. If such a capacitor is successfully retrieved from the capacitor library 11, the judgment section 24 determines the retrieved capacitor as the desired decoupling capacitor. On the other hand, if such a capacitor is not retrieved from the capacitor library 11, the judgement section 24 instructs the voltage fluctuation input section 21 to revise the allowable fluctuation $\Delta V$. The capacitance of the decoupling capacitor is thus determined.

The source line designing block 15 of FIG. 6 determines the length and the width of the source line necessary for decoupling the source line based on the impedance characteristic of the decoupling capacitor determined by the decoupling capacitor designing block 14 and an allowable minimum multiplexing ratio (N) of the decoupling capacitor.

For an effective decoupling of the source line, the current $I_{PS}$ flowing through the inductor or source line 53 in FIG. 1 must be sufficiently lower than the current $I_C$ flowing through the decoupling capacitor 52. The multiplexing ratio setting section 25 sets an allowable minimum multiplexing ratio "N", which may be 10 for a practical use, for example.

The inductance calculating section 26 calculates the inductance of the source line based on the impedance $Z_C(f)$ of the decoupling capacitor so that the ratio of the current spectrum $I_C(f)$ flowing through the decoupling capacitor 52 to the current spectrum Ips(f) flowing through the inductor 53 in the design frequency range between fmin and fmax is equal to or above the allowable minimum multiplexing ratio N. The decoupling capacitor used herein is that determined by the decoupling capacitor designing block 14.

More specifically, an inductance satisfying the following relationship:

$$Ic(f) \geq N \times Ips(f) \quad (1)$$

is obtained as the inductance of the source line for the frequency "f" residing in the design frequency range between fmin and fmax, i.e., for fmin$\leq$f$\leq$fmax.

In a practical calculation, the relationship (1) can be satisfied if the following relationship:

$$2\pi f \times L \geq N \times |Zc(f)| \quad (2)$$

holds between the impedance of the source line $2\pi f \times L$ and the impedance Zc(f) of the decoupling capacitor for fmin$\leq$f$\leq$fmax.

Figure 7A:
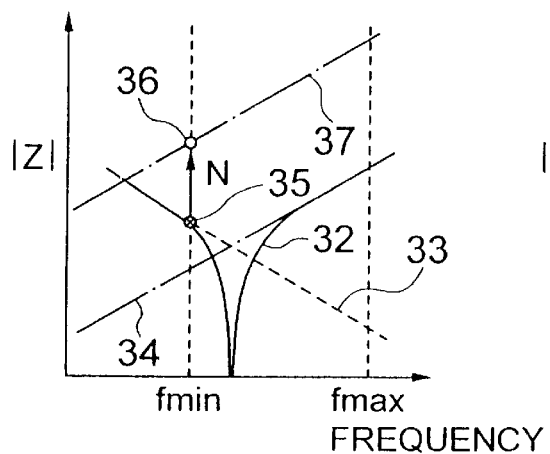
FIGS. 7A and 7B are graphs for showing the determination of the effective impedance of the decoupling capacitor.
Figure 7B:
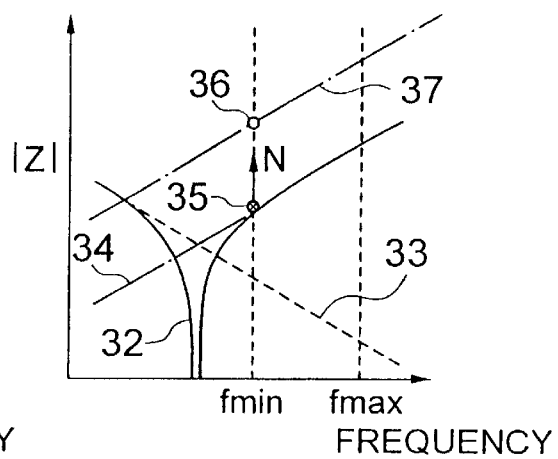

The inductance of the inductor, i.e., the source line 53 is determined as follows. Referring to FIGS. 7A and 7B, wherein both the abscissa and ordinate are plotted with logarithmic scales, curve 32 corresponds to the absolute value of the impedance Zc(f) of the decoupling capacitor, line 33 corresponds to the absolute value $1/(2\pi f \times C)$ of the impedance determined by the capacitance "C" of the decoupling capacitor, and line 34 corresponds to the absolute value $2\pi f \times Lc$ of the impedance determined by the equivalent serial inductance Lc of the decoupling capacitor.

The absolute value |Veff(fmin)| of the effective impedance of the decoupling capacitor at the minimum frequency fmin is selected from the impedances $1/(2\pi \times fmin \times C)$ shown at point 35 and $2\pi \times fmin \times Lc$ as a higher one of them. The inductance L of the source line is calculated from the absolute value |Veff(fmin)| (at point 35) of the effective impedance of the decoupling capacitor as follows:

$$L = N \times |Zeff(fmin)|/(2\pi \times fmin) \quad (3)$$

Line 37 in each of FIGS. 7A and 7B corresponds to the absolute value $2\pi \times f \times L$ of the impedance of the source line, passes point 36 which corresponds to N×|Zeff(fmin)|, and has a gradient equal to the gradient of line 34. Thus, the relationship (2) can be satisfied at any frequency within the design frequency range.

The width determining section 27 in FIG. 6 determines the line width W of the source line based on the average current Iave of the object LSI registered in the LSI library 10 and the minimum line width (k) of the source line for per unit current registered in the PCB library 12. The line width W is determined as follows:

$$W \geq k \times Iave \quad (4).$$

Figure 8A:
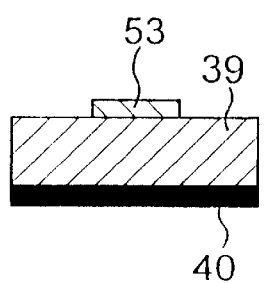
FIGS. 8A and 8B are sectional views of the printed circuit boards for showing the layered structure thereof.
Figure 8B:
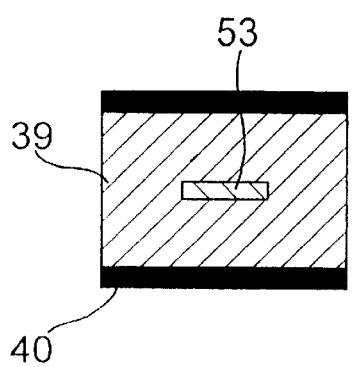

The inductance per unit length calculating section 28 calculates the inductance per unit length (Lunit) of the source line which is determined by the layer structure, line thickness, dielectric constant, permeability, and the width "W" of the source line of the PCB. The layer structure of the PCB is exemplified in FIGS. 8A and 8B. The source line 53 may be disposed on the top surface of a dielectric layer 39 having a bottom surface in contact with a grounded conductor layer 40, as shown in FIG. 8A, or may be sandwiched between first surfaces of a pair of dielectric layers 39 each having a second surface in contact with a grounded conductor layer 40, as shown in FIG. 8B. In either case, the inductance per unit length (Lunit) of the source line can be calculated based on the structure of the PCB.

The length calculating section 29 calculates the length (lp) of the source line based on the inductance L obtained by the inductance calculating section 26 and the inductance per unit length (Lunit), as follows:

$$lp = L/Lunit \quad (5).$$

The length examining section 30 examines whether the length lp of the source line calculated by the length calculating section 29 is longer than the maximum length Lmax of the source line prescribed beforehand. The maximum length Lmax is determined based on the wavelength λ corresponding to an uppermost frequency (fend), which is defined later and may be fmax, and a maximum factor α for the source line as follows:

$$lmax = \alpha \times \lambda \quad (6).$$

The user can arbitrarily determine the maximum factor α for the source line.

The width and the length of the source line are thus determined.

The information for the decoupling capacitor and the width and length of the source line as obtained is delivered as the decoupling circuit design data 16 from the source line designing block 15, as shown in FIG. 3. The thus obtained decoupling circuit design data 16 is delivered for each of the source lines of the object LSIs, and includes all the necessary information for designing the decoupling circuits. The decoupling circuit design data 16 includes part number, capacitance C, equivalent serial resistance Rc, equivalent serial inductance Lc etc. for the decoupling capacitor as well as the layered structure of the PCB, thickness "t" of the conductor layer therein, width "W" and the length lp of each of the source lines etc. The decoupling circuit design data 16 is supplied to a CAD system for layout design, which operates for the automated layout design for the source lines of all the LSIs to be disposed on the PCB.

Figure 9:
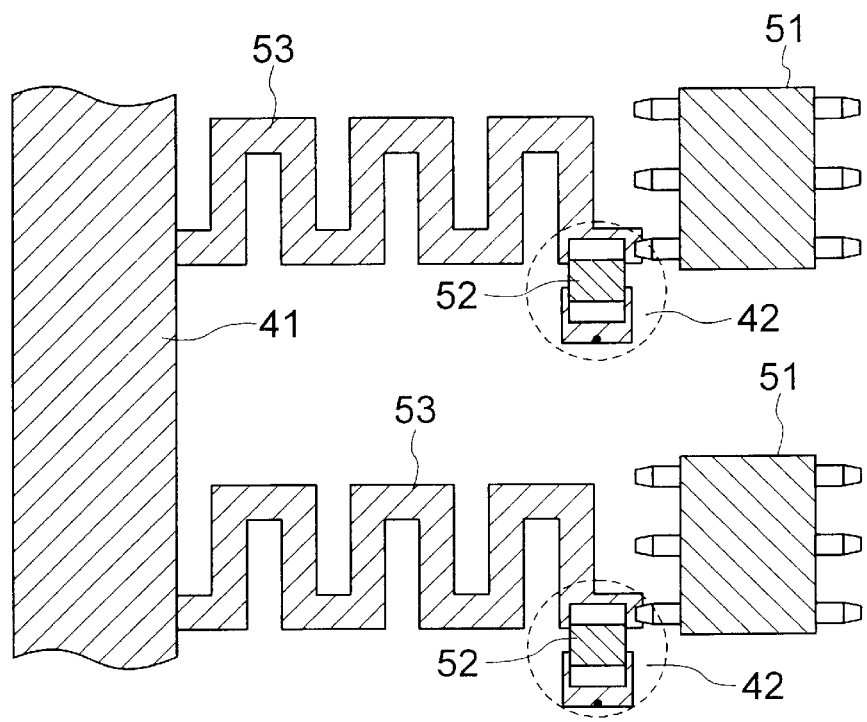
FIG. 9 is a top plan view of the printed circuit board for showing an example of the source lines designed by the embodiment of the present invention.

FIG. 9 shows an example of such layout design output from the CAD system. The layout of LSIs 51 and the main source line 41 are manually determined by the user. Each branch source line 53 as well as each decoupling capacitor 52 is determined by the CAD system. In this example, each source line 53 has a zigzag structure for achieving the desired length lp of the source line which conforms to the desired inductance of the source line. The decoupling capacitor 52 is connected at the node connecting the source line 53 and the source terminal of the LSI.

Figure 10:
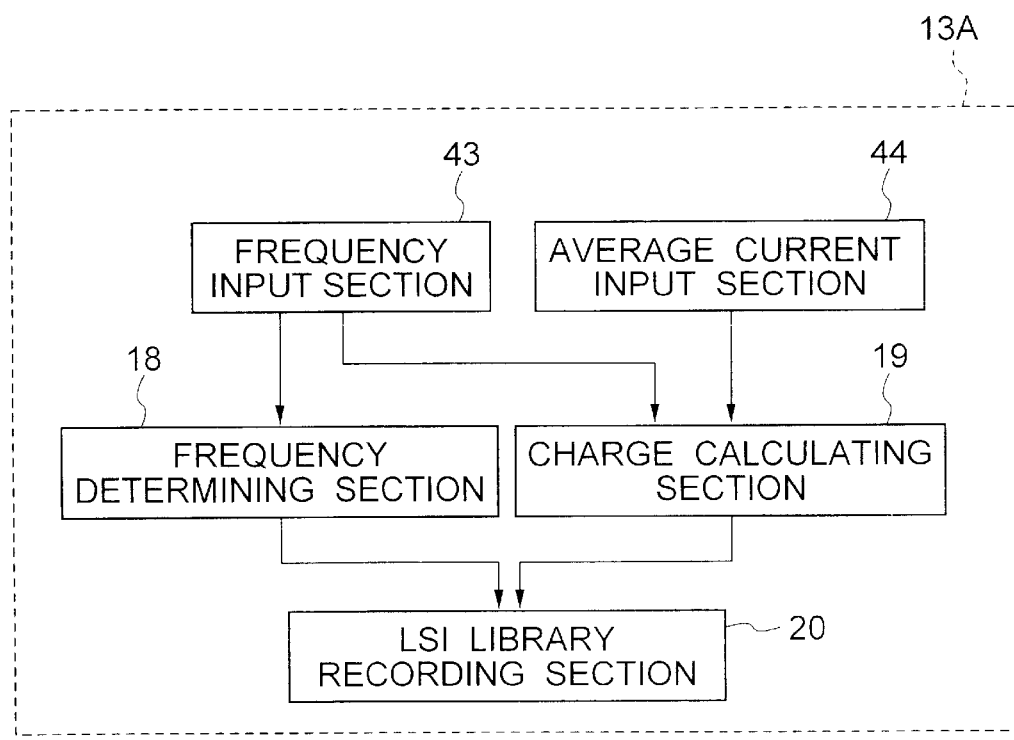
FIG. 10 is a block diagram of another example of the library composer shown in FIG. 3.

Referring to FIG. 10, there is depicted a modification of the LSI library composer 13 shown in FIG. 4. The modified LSI library composer 13A includes a frequency input section 43 and an average current input section 44 instead of the waveform input section 17 in the LSI library composer 13, and has other configurations similar to those of the LSI library composer 13.

The frequency input section 43 inputs the operational frequency f0 of the LSI to be disposed on the PCB, whereas the average current input section 44 inputs the average current Iave flowing through the source terminal of the LSI, both based on the operation by the user. The design frequency determining section 18 determines the minimum and maximum frequencies of the object LSI based on the operational frequency f0. The charge calculating section 19 determines the electric charge "Q" necessary for one cycle operation of the LSI based on the clock period of the LSI, which is reciprocal of the operational frequency f0, and the average current Iave, as follows:

$$Q = Iave/f0 \quad (7).$$

Figure 11:
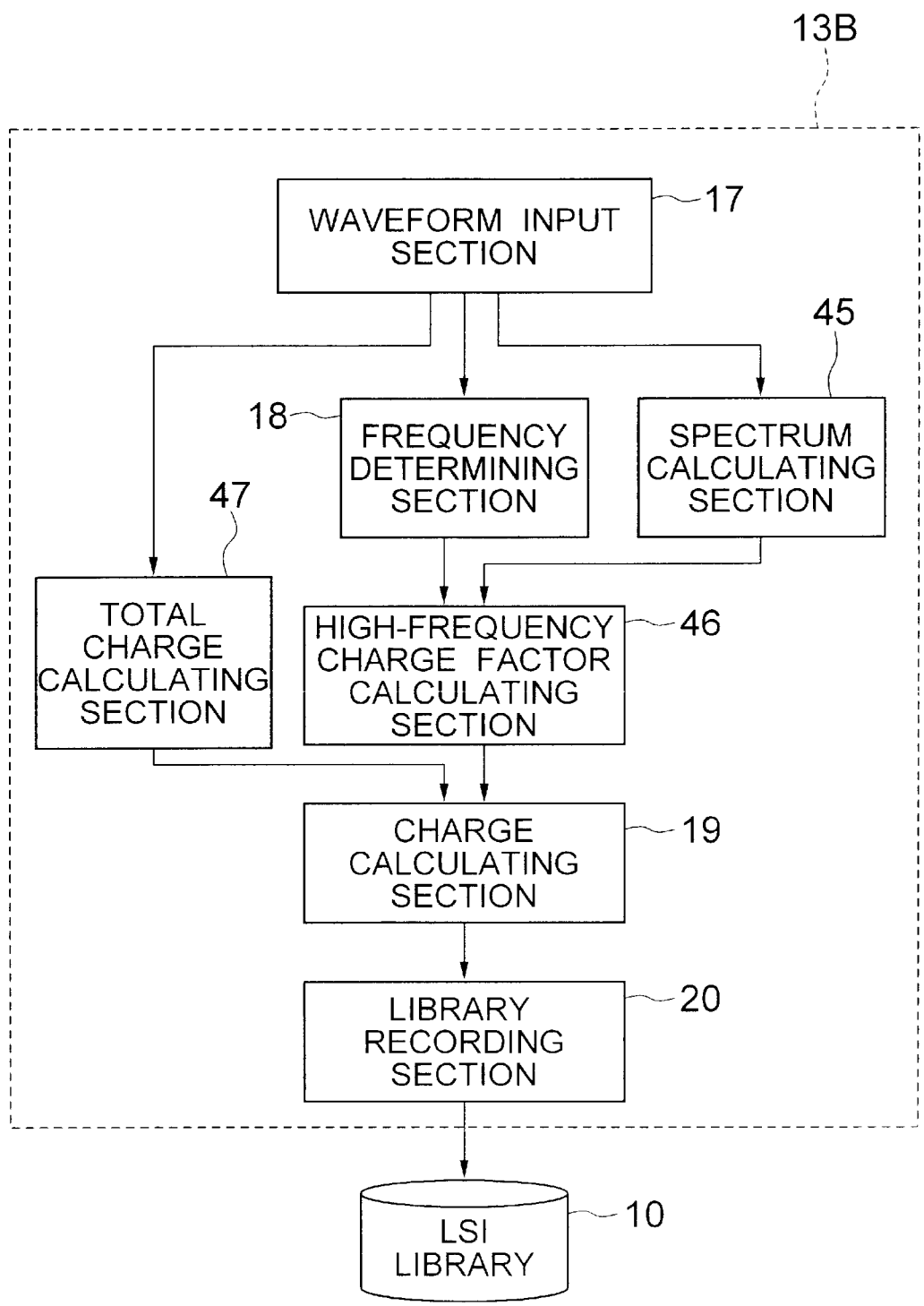
FIG. 11 is a block diagram of another example of the library composer shown in FIG. 3.

Referring to FIG. 11, a further modification of the LSI library composer, designated by numeral 13B, includes a current spectrum calculating section 45, a current factor calculating section 46 and a total current calculating section 47, in addition to the sections 17 to 20 in the LSI library composer 13 shown in FIG. 4.

Figure 12:
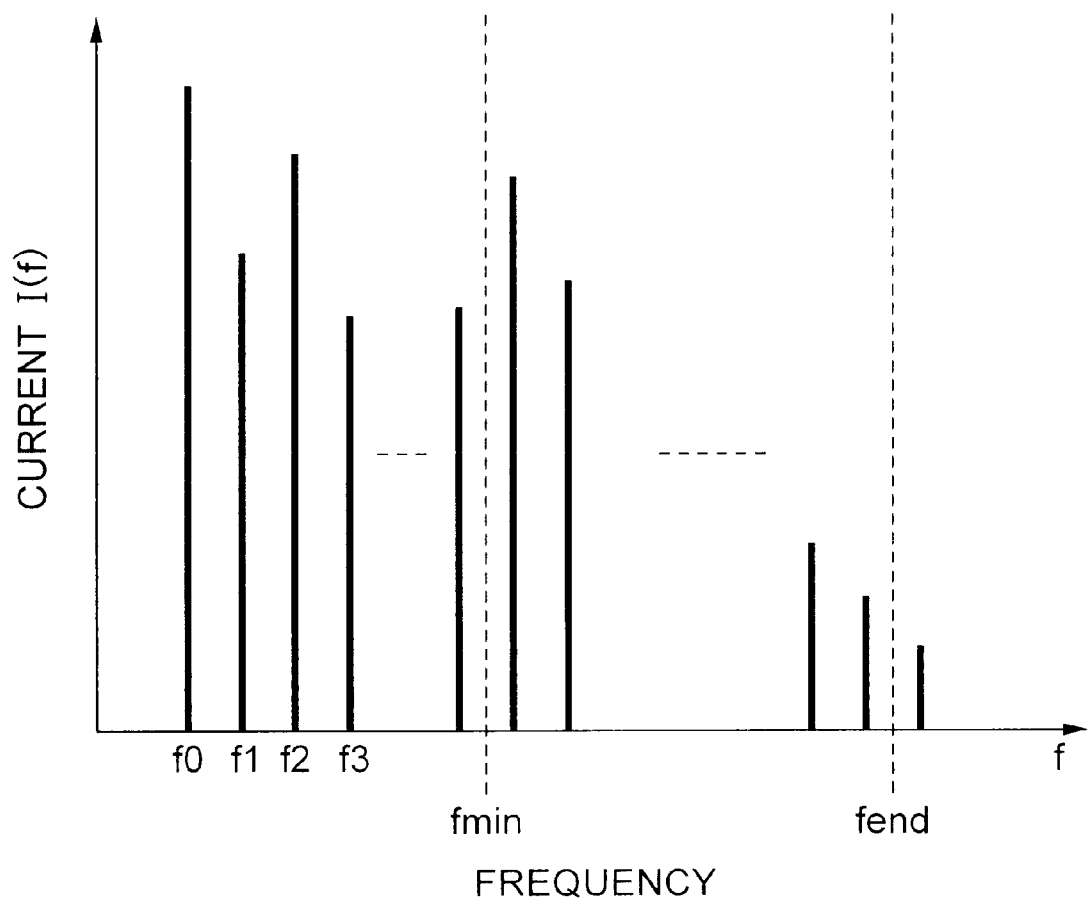
FIG. 12 is a spectrum diagram of the source current for a LSI.

The current spectrum calculating section 45 calculates the spectrum of the source current of the object LSI. Referring to FIG. 12, the source current of the LSI includes a zeroth-order current component having the operational frequency f0, a first order current component having a first order frequency f1 which is twice the operational frequency f0, second and higher order components having a second and higher order frequencies f2, f3, . . . , which are integral multiples of the operational frequency f0. These frequencies f0, f1, f2, . . . are separated into three frequency bands including a first band lower than the minimum frequency fmin as described before, a second band between the minimum frequency fmin and the uppermost frequency fend, and a third band higher than the uppermost frequency fend.

The uppermost frequency fend may be determined equal to the maximum frequency fmax as described before or may be a frequency fk at which the source current has a current component I(fk) lower than a threshold prescribed by the user.

The spectrum components between f0 and fend are added to obtain a substantially total current in the design frequency as follows:

$$\sum_{f0 \leq fn \leq fend} I(fn) \quad (8)$$

The spectrum components between fmin and fend are also added to obtain a higher-frequency current component as follows $$\sum_{fmin \leq fn \leq fend} I(fn) \quad (9)$$

A current factor β is defined here by the higher-frequency current component divided by the substantially total current as follows:

$$\beta = \frac{\sum_{fmin \leq fn \leq fend} I(fn)}{\sum_{f0 \leq fn \leq fend} I(fn)} \quad (10)$$

The current factor β means the ratio of the higher-frequency current components to the total current in the source current of the LSI.

In this example, the electric charge "Q" necessary for one cycle operation of the LSI is obtained as the product of the total electric charge supplied through the source terminal in one operational cycle by the current factor β.

Figure 13:
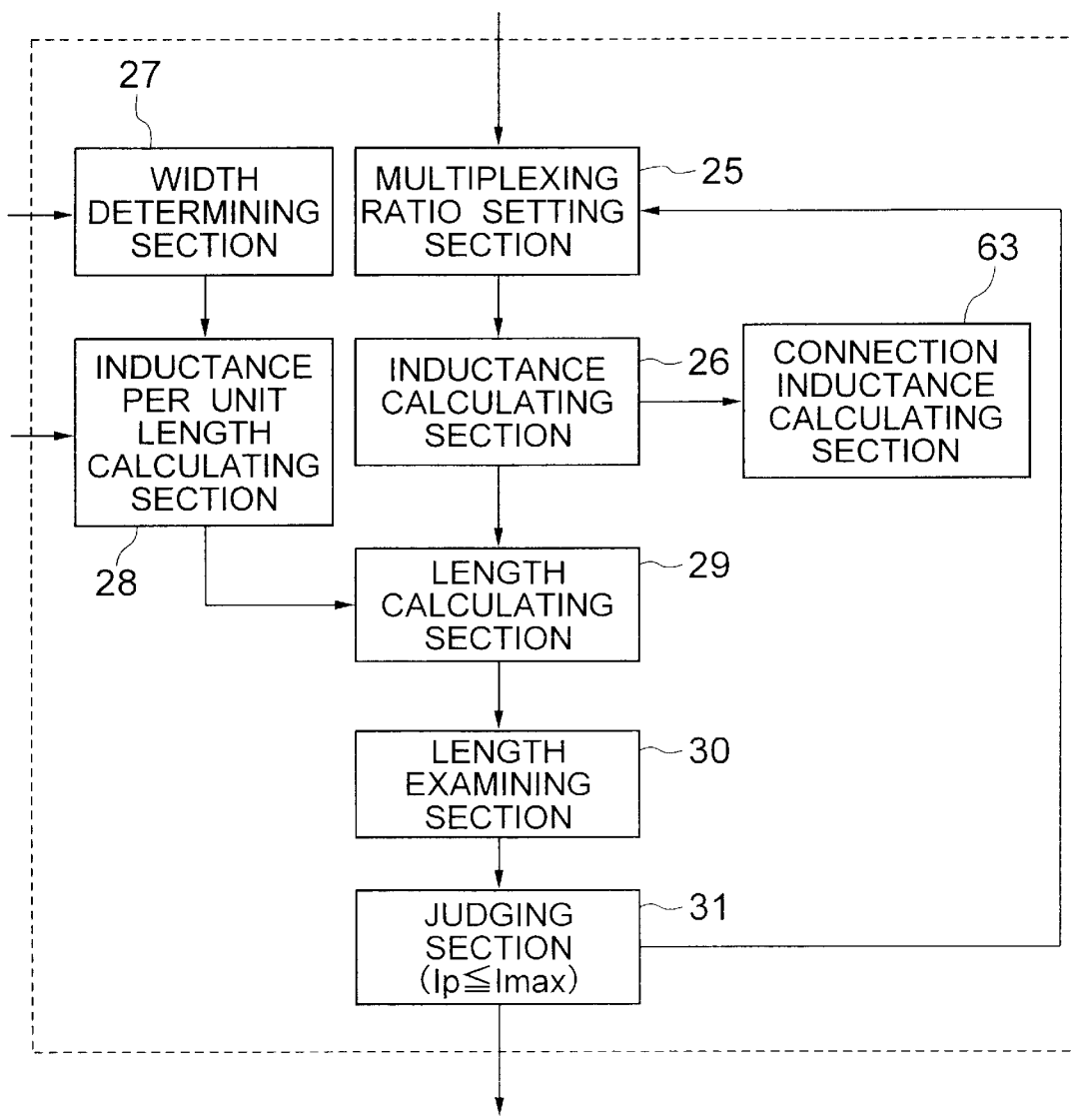
FIG. 13 is a block diagram of another example of the source line designing block shown in FIG. 3.

Referring to FIG. 13, a modification of the source line designing block, designated by numeral 15A, includes a connection inductance calculating section 63 in addition to the sections 25 to 31 in the source line designing block 15 shown in FIG. 6. The connection inductance calculating section 63 calculates the equivalent inductance Lg of the connection between the terminal of the decoupling capacitor 52 and the terminal of the ground layer of the PCB.

Figure 14A:
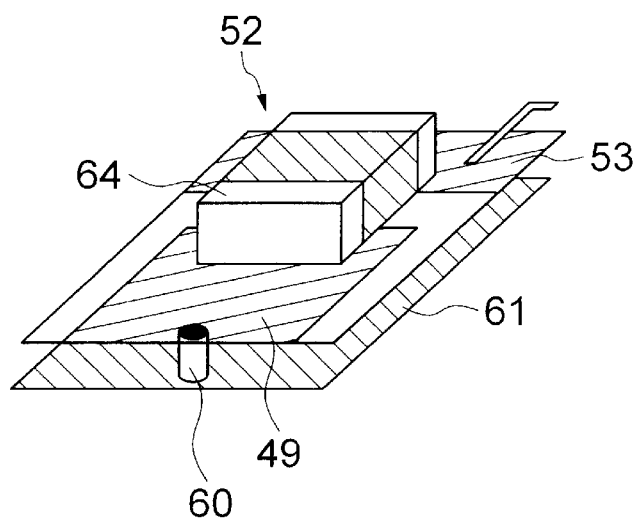
FIG. 14A is a perspective view of a portion of the printed circuit board for showing the parasitic inductance of connection between the decoupling capacitor and the ground layer.
Figure 14B:
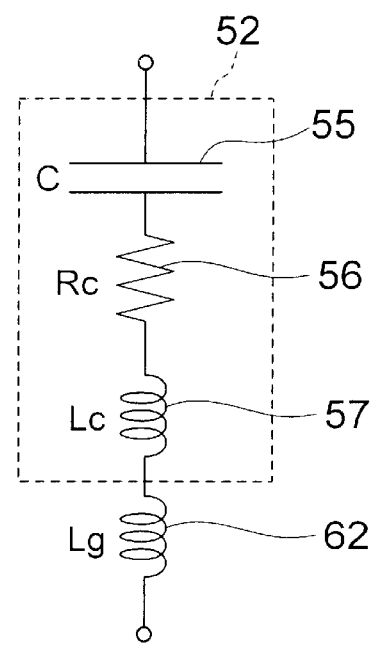
FIG. 14B is an equivalent circuit diagram of the decoupling capacitor and the parasitic inductance.
Figure 15:
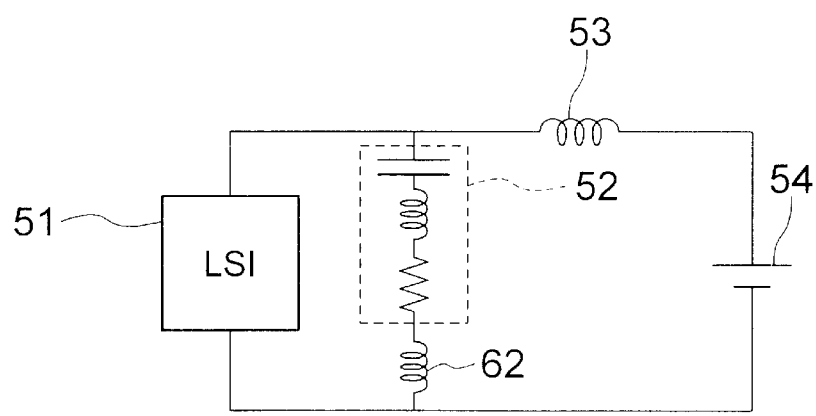
FIG. 15 is a circuit diagram of a decoupling circuit designed by the modified embodiment of the present invention shown in FIG. 13.

Referring to FIG. 14A, the decoupling capacitor 52 has a first terminal 64 mounted on a terminal layer 49, which is connected to the ground layer 61 of the PCB through a via hole 60. The terminal layer 49 and the via hole 60 in combination add a connection inductance Lg (62) to the decoupling capacitor 52, as shown in FIG. 14B. That is, the decoupling capacitor 52 has a capacitance C, equivalent serial resistor Rc and an equivalent serial inductance (Lc+Lg).

The relationship (2) is replaced herein as follows:

$$2\pi f \times L \geq N \times |Zpc(f)| \text{ (for fmin} \leq f \leq \text{fmax)} \quad (11)$$

wherein Zpc(f) is the sum of the impedances of the decoupling capacitor 52 and the connection between the decoupling capacitor 52 and the ground layer 49.

The absolute value |Zeff(fmin)| of the effective impedance at the minimum frequency is defined as one of the absolute impedance $1/(2\pi \times \text{fmin} \times C)$ of the capacitance of the decoupling capacitor and the impedance of the sum of the equivalent inductances Lc+Lg, which is higher than the other of the two impedances. The information for the equivalent inductance Lg of the connection is supplied through the connection inductance input section 63. In an alternative, the equivalent inductance Lg may be stored in the PCB library 12.

Since the above embodiments are described only for examples, the present invention is not limited to the above embodiments and various modifications or alterations can be easily made therefrom by those skilled in the art without departing from the scope of the present invention.

What is claimed is:

1. A method for designing a decoupling circuit for a source line of a LSI to be disposed on a printed circuit board, the method comprising the steps of determining a capacitance of a decoupling capacitor based on electric charge necessary for driving the LSI in a specified period and an allowable voltage fluctuation of a source voltage at a source terminal of the LSI, and determining an inductance of the source line based on an impedance of the decoupling capacitor and an allowable minimum multiplexing ratio of a source current of the LSI by the decoupling capacitor.

2. The method as defined in claim 1, wherein the electric charge is calculated from an integral of a waveform of the source current.

3. The method as defined in claim 1, wherein the electric charge is calculated based on an average source current and an operational frequency of the LSI.

4. The method as defined in claim 1, further comprising the step of calculating a first sum of higher-frequency current components and a second sum of total current components of the source current based on a spectrum of the source current, wherein the electric charge is calculated based on a ratio of the first sum to the second sum and a total charge passing through the source terminal to the LSI.

5. The method as defined in claim 4, wherein each of the higher-frequency components has a frequency higher than a minimum design frequency.

6. The method as defined in claim 1, wherein the inductance of the source line is calculated based on an effective impedance of the decoupling capacitor and the multiplexing ratio, the effective impedance being selected from an absolute value of an impedance corresponding to the capacitance of the decoupling capacitor at a minimum design frequency and an absolute value of an impedance corresponding to a serial inductance of the decoupling capacitor at the minimum design frequency, as a larger one of both the impedances compared to the other of both the impedances.

7. The method as defined in claim 6, wherein the serial inductance of the decoupling capacitor includes an equivalent inductance of the decoupling capacitor and an equivalent inductance of a connection between a ground layer and the decoupling capacitor.

8. The method as defined in claim 1, further comprising the step of determining a length of the source line from the inductance of the source line based on width and thickness of the source line and thickness of dielectric constant and permeability of a dielectric layer.

9. The method as defined in claim 1, wherein the specific period is one clock cycle of the LSI.

* * * * *